United States Patent [19]

Koljonen

[11] Patent Number: 5,982,927
[45] Date of Patent: Nov. 9, 1999

[54] METHODS AND APPARATUSES FOR IN-LINE SOLDER PASTE INSPECTION

[75] Inventor: Juha Koljonen, Needham, Mass.

[73] Assignee: Cognex Corporation, Natick, Mass.

[21] Appl. No.: 09/211,539

[22] Filed: Dec. 15, 1998

Related U.S. Application Data

[63] Continuation-in-part of application No. 08/769,739, Dec. 19, 1996, Pat. No. 5,912,984.

[51] Int. Cl.[6] ........................................... G06K 9/00
[52] U.S. Cl. ............................... 382/168; 382/145
[58] Field of Search .............................. 73/660; 704/231; 709/219; 382/141, 143, 144, 145, 146, 147, 148, 149, 150, 151, 168, 169, 170, 171, 172, 173, 174, 175, 176, 181, 190, 195, 209, 217, 224, 254, 278, 279, 284, 307, 308

[56] References Cited

U.S. PATENT DOCUMENTS

| | | | |
|---|---|---|---|
| 4,672,667 | 6/1987 | Scott et al. | 381/41 |
| 5,471,880 | 12/1995 | Lang et al. | 73/660 |
| 5,889,951 | 3/1999 | Lombardi | 395/200.49 |

Primary Examiner—Bijan Tadayon
Attorney, Agent, or Firm—Tracy Calabresi; Russ Weinzimmer

[57] ABSTRACT

Inspection of solder paste on a printed circuit board using a histogram of an image before printing (pre-application image) to normalize an image after printing of the printed circuit board (post-application image) is described. Existing lighting and optics used for alignment of the screen-printing stencil to the printed circuit board are used for the solder paste inspection.

28 Claims, 7 Drawing Sheets

METHODS AND APPARATUSES FOR IN-LINE SOLDER PASTE INSPECTION

This application is a continuation in part of application Ser. No. 08/769,739 filed Dec. 19, 1996, now U.S. Pat. No. 5,912,984.

FIELD OF THE INVENTION

The present invention relates to machine vision and automated inspection systems, and more particularly to a method and apparatus for inspection over a sequence of process steps.

BACKGROUND OF THE INVENTION

The process of assembling printed circuit boards (PCBs) generally requires solder paste to be applied to the printed circuit board before components, such as integrated circuits and discrete devices, are placed and ultimately secured onto the board. Initially, the sticky solder paste temporarily holds the components in place on the PCB until the solder paste is melted or reflowed. When the solder paste is reflowed it forms both mechanical and electrical connections between the components and the board. If there is not enough solder paste, components may be inadequately mechanically and/or electrically connected to the PCB. If there is too much solder paste or if solder paste is deposited in the wrong place, an extra or incorrect electrical connection such as a short circuit may result, generally referred to as a "solder bridge".

Automated processes for fabricating PCBs are generally known, including process steps for applying solder paste to printed circuit boards using screen printing techniques. Prior to printing, a thin metal stencil or template is constructed with openings or apertures matching appropriate places on a particular PCB where paste should be printed. During printing the stencil is aligned to the PCB. The solder paste is then applied to the PCB through the stencil openings, typically using a squeegee to spread the paste. Then the stencil is lifted off of the PCB which is transported to its next manufacturing process step.

Automatic inspection or vision systems may be used in known processes to detect problems in the printing process, including problems associated with the stencil and problems associated with the application of paste to the PCBs. Stencil blockage may be detectable wherein dried solder paste or debris causes stencil openings to clog. It is desirable to detect stencil blockage by inspecting the stencil before any printed circuit boards are actually misprinted with solder paste. Stencil smearing may be detectable wherein solder paste smears around the stencil openings on a side of the stencil adjacent to the PCB. It is also desirable to detect stencil smearing by inspecting the stencil before any boards are actually misprinted with solder paste. Misalignment of the stencil and PCB may be detectable prior to distribution of solder paste by inspection of the stencil position relative to the PCB before printing thereon. The PCB can be inspected to detect incorrect solder paste distribution after printing. Automatic inspection may be used to determine if there is too little solder paste, too much solder paste, or solder paste in the wrong place on the printed circuit board.

The automated inspection of solder paste on PCBs is inherently difficult to accomplish. The solder paste is difficult to identify on the PCB because it is variable in terms of its appearance. The paste appearance varies over time, e.g. wet paste has a different appearance than dry paste. The paste has texture and the gray level reflectance of the paste is similar to solder pads with tinning and other circuitry on the PCB. Also, the three dimensional shape of the paste causes shadowing, making automated inspection difficult. The inherent difficulty is exacerbated by variability from one PCB to the next. For example, the color of boards of a single board type in one printing run can vary from light green to dark green or blue. In one printing run, the relative positioning of portions or all of a PCB of a single board type may vary with respect to the stencil or solder mask on the board. Additionally, all of the circuitry on a board is subject to dimensional variability. Perhaps most significantly, the solder paste deposited on a board can obscure solder pads beneath it making it impossible to tell either what is beneath the solder paste or what is the relative alignment of the solder paste to what is beneath it. For instance, if the solder paste is exactly the same size and shape as the solder pad beneath it, it may be impossible to tell whether there is perfect coverage or no coverage at all.

Known in-line or image automated inspection systems for solder paste inspection do not adequately overcome such difficulties. Some known systems typically only perform inspection based on an image of the PCB captured after the solder paste has been deposited thereon (referred to hereinafter as "post-only" systems). Known post-only systems typically use a vision/inspection tool that assigns gray scale values to pixels of a captured image of a PCB under inspection after printing. Pixels are classified as being not-paste or paste based on their gray scale value. Pixels are aggregated for particular areas of interest on the PCB, in a connectivity analysis in which pixels connected to one another and identified as being paste are labeled as belonging to the same lump of paste. Characteristics of interest related to the aggregation of pixels, such as area, center of mass, and size of enclosing rectangle, are determined and ultimately used by an operator to adjust parameters of the printing process to maintain the post-printing product within acceptable tolerances.

Unfortunately, color variation in the underlying areas of the PCB negatively affects the inspection process because gray scale values will vary according to the color variation of the underlying portions of the PCB, especially near the paste edge where the solder paste is thin. Variability in color/composition of the solder paste may also cause gray scale variations that negatively affect the inspection process. Similarly, known post-only systems may be negatively affected by lighting, which must be rigorously controlled in order to avoid negative affects on the inspection process due to shading or reflection of light from components of the system. In general, the yield and accuracy of known post-only solder inspection systems are not sufficient to make such systems useful or practicable.

Many known solder paste inspection systems are stand-alone (i.e. not "in-line") stations dedicated to performing solder paste inspection apart from and subsequent to the screen printing process step(s). Such stand-alone systems include optics and lighting that are optimally configured for the inspection of solder paste. The optics and lighting dedicated to solder paste inspection represent costly, redundant hardware in the PCB fabrication process flow in that similar optics and lighting are necessary upstream in the process flow to effect registration or alignment in the screen printing stage. Furthermore, stand-alone solder paste inspection systems typically incorporate laser stripers and other very expensive and sophisticated hardware that is often difficult to justify in a cost/benefit analysis. Stand-alone systems disadvantageously introduce additional machine set-up time and maintenance, require additional factory floor space to implement, and introduce additional undesirable handling of PCBs to convey them through the stand-alone inspection stage. Generally, a stand-alone solder inspection system will represent a significant overall reduction in throughput in a PCB fabrication line.

SUMMARY OF THE INVENTION

The present invention provides methods and apparatuses for identifying a first region within a second-state image using at least one first-state characteristic. In a preferred embodiment after the first region has been identified, the invention determines how the first region has changed within the second-state image relative to the first region in a first-state image.

The first-state image and the second-state image differ from one another, where the first-state image and the second-state image are, for example, images of a product at different stages in a manufacturing or printing process.

The first region may or may not differ between the first-state image and the second-state image, but the difference or lack thereof is detectable by the methods and apparatuses of the invention. The first region is, for example, an uncovered pad region of a printed circuit board in the first-state image and a partially covered solder-paste pad region, a completely covered solder-paste pad region, or an uncovered pad region in the second-state image.

The first-state characteristic represents an aspect of the first region within the first-state image, such as the area of the pad region. In a preferred embodiment, the first-state characteristic is a first-state histogram, which represents more than one aspect of the first region. However, the first-state characteristic can be any form of extracted data.

The invention detects the first region by generating a second-state histogram of the second-state image and then by using the first-state characteristic to augment the representation of the first region within the second-state histogram relative to at least one other region in the second-state histogram. Once the first region is enhanced within the second-state histogram, the first region is more easily identifiable and can be used to ascertain further information about the second-state image. Details of the second-state image and regions within the second-state image can be detected, including the extent of the first region as well as the existence and the extent of other regions.

In one embodiment, the invention enhances the first region by selectively combining the first-state histogram with the second-state histogram to produce an augmented second-state histogram. In the augmented histogram, an intensity value of each bin within the first region is the greater of the intensity values of the first region from either the first-state histogram or the second-state histogram.

In another embodiment, the invention enhances the first region relative to one other region by zeroing the intensity values of at least one other region within the second-state histogram to produce an augmented second-state histogram. To zero the intensity values of at least one other region, the invention calculates the area of the first region of in the first-state image. Then, the invention identifies a region in the second-state histogram that substantially contains the area of the first region of the first-state image. For at least part of the pixels in the area substantially outside the identified region, the invention zeros the intensity values of those pixels. The non-zero intensity values that remain in the augmented second-state histogram include the pixels that represent the first region. In one embodiment, the invention zeros all of pixels from areas outside of the area of the first region. Thus, the non-zero intensity values that remain have an area that substantially equals the area of the first region. Further in a preferred embodiment, the area is determined from the first-state histogram.

Also in a preferred embodiment, the second-state histogram is enhanced by both selectively combining the first-state histogram with the second-state histogram and removing a portion of the intensity values from the second-state histogram.

It is recognized by the invention that information about any region, such as the extent of a paste region or presence of a region, for example, within the second-state image can be determined using a first-state characteristic, such as a first-state histogram, of the first-state image.

It is recognized by the invention that information which is typically difficult to discern from the second-state image can more easily be determined using the information derived from the first-state characteristic. Consequently, the invention is particularly useful for identifying otherwise poorly defined regions within the second-state histogram.

The present invention can be advantageously used with a screen printing process, the invention identifying solder paste and determining if the paste covers a pad region of a PCB. In this application, a pre-paste application histogram (first-state histogram) of a pre-paste application image (first-state image) augments a post-application histogram (second-state histogram) of a post-paste application image (second-state image) so that a threshold of the paste/pad region transition is easily identified within the augmented second-state histogram. Optionally, the post-paste application image is binarized using the paste/pad threshold, thereby producing a binary image that segments the uncovered pad region from the rest of the image.

In other aspects, the method is enhanced by using a model of the first-state image to analyze the second-state image or the optionally generated binary image, e.g. a model of a position and shape of the pad area. The model of the first-state image is aligned with the second-state image or the optionally generated binary image and then compared. The comparison yields whether the aligned region(s) are different, and therefore, whether the region(s) have changed between the first-state image and the second-state image. For example, the comparison yields the extent of the paste on the pad region.

In a preferred embodiment, an optional model is registered with the first-state image to isolate selected region(s) of the first-state image. The model can, for example, window selected regions, such as pad regions. The model aligned with the first-state image produces an aligned first-state image upon which the first-state characteristic, such as a histogram, is generated. The first-state characteristic substantially represents only the regions isolated by the model.

This enhancement of the first-state characteristic, (i.e. the selection of regions represented within the first-state characteristic) makes the calculation of the area of the selected region, such as the pad region, from the first-state image more simple and reliable. Consequently, the area examined in the second-state histogram will also more reliably represent the pad region.

Features of the invention include provision of an automated inspection system, optionally used in-line during screen printing of PCBs, that avoids redundant hardware and associated cost by effecting inspection using existing lighting and/or optics present in the screen printing equipment for alignment purposes. The technique implemented in several embodiments of the invention normalizes each board with a histogram of that same board without paste and therefore avoids problems associated with prior art post-only inspection systems resulting from variations in board color, solder mask shifting and/or board or component dimension variability. Through the use of the histogram of the pre-application image as opposed to the storage of the pre-application image, each inspection requires less memory resources, and therefore allows an increased number of inspections per board.

Various problems with prior art solder paste inspection systems are overcome by the method and apparatuses according to the invention, including problems resulting from pads being covered by paste so that they are not visible or otherwise distinguishable, and problems resulting from an inability to distinguish among pads that have no paste on them and pads that are exactly 100% covered by paste. Several embodiments of the methods and apparatuses according to the invention benefit from implementation of a data gathering method that achieves the benefits of the subtraction procedure without the constraints of the registration mechanism as taught by other embodiments of the invention.

BRIEF DESCRIPTION OF THE DRAWING

The foregoing and other features and advantages of the present invention will be more fully understood from the following detailed description of illustrative embodiments, taken in conjunction with the accompanying drawing in which:

FIG. 2b is an illustration of blocking regions where solder paste blockage is looked for in the stencil apertures of FIG. 2a;

FIG. 2c is an illustration of smearing regions where smearing is looked for in the stencil apertures of FIG. 2a;

DETAILED DESCRIPTION

Figure 1:
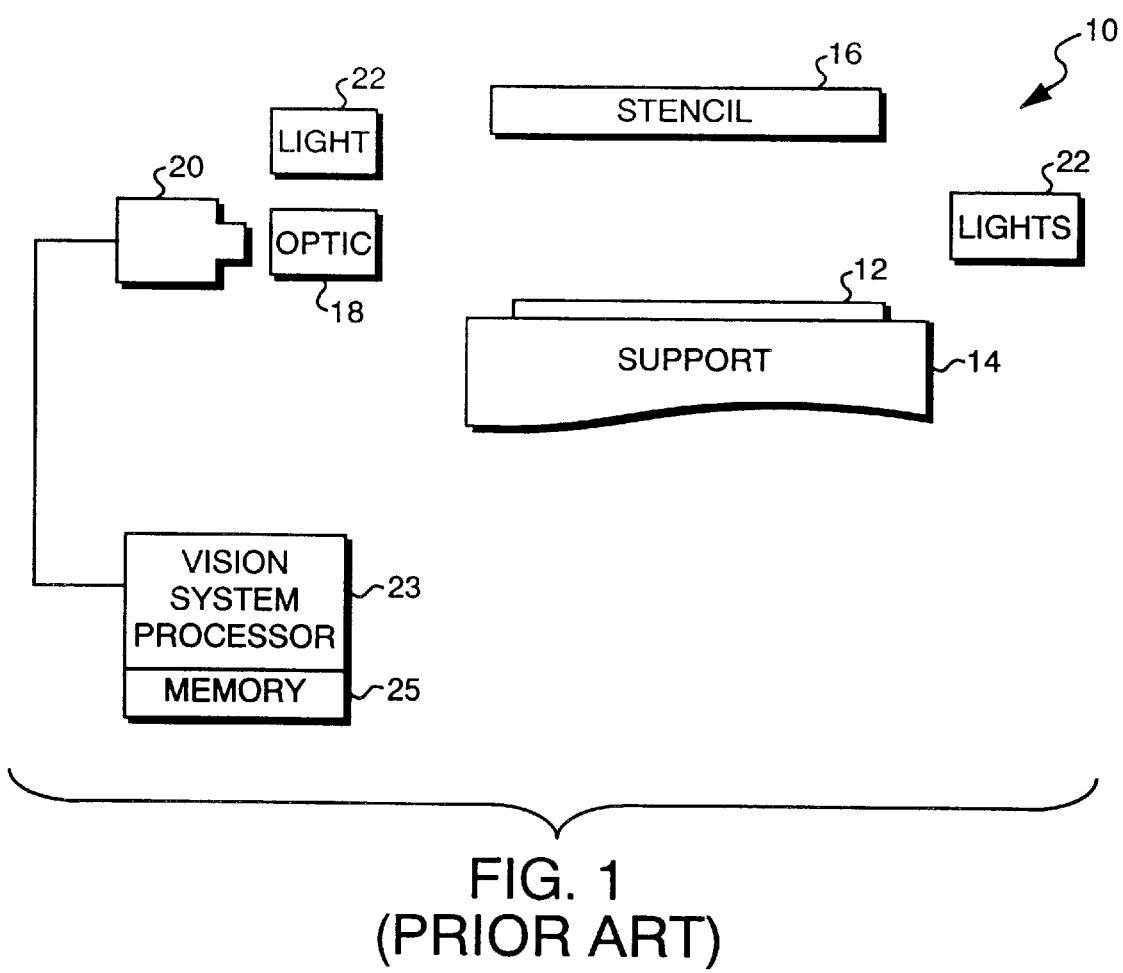
FIG. 1 is a schematic diagram of components of a screen printing system as known in the art.

The present invention is useful in the context of many multi-step printing processes and manufacturing processes, including solder paste screen printing systems known in the art. Solder paste printing using screen printers is typically effected on bare printed circuit boards (PCBs) in a manufacturing production line prior to placement of components on the board. The bare PCB is placed on or transported to a screen printing station 10, such as illustrated in FIG. 1, whereat the PCB 12 is held firmly in place on a support 14 by either vacuum or mechanical means. The screen printing station includes an upper portion that houses a stencil 16 having apertures that correspond to areas of interest on the PCB, such as solder pads, where solder is to be disposed.

Optics 18, such as movable telecentric optics, a CCD camera 20 and flash lighting 22 all known in the art are used in conjunction with a vision system, such as a Cognex 5000 Series vision system and vision tools known in the art, to capture images of stencil 16 and board 12 fiducials to effect registration, i.e. alignment of the stencil to the board. It should be noted that the placement of lighting 22, the camera 20 and optics 18 is a function of the particular vision system configuration and application as known in the art, and as provided herewith FIG. 1 is not intended to be illustrative of any particular implementation or application. The illustrative system effecting the functionality described hereinafter incorporates a vision system processor 23 receiving signals, typically captured image signals, from the camera 22. The vision system processor 23 has access to a memory 25 in which it stores information processed in effecting the inspection system according to the invention.

Generally, in the screen printing process registration or alignment between the stencil and the PCB is accomplished, such as by a method involving registration of fiducials as described in commonly owned U.S. Pat. No. 5,550,906 which is incorporated herein by reference, and the stencil 16 is lowered or actuated to a position proximate to the PCB. The solder paste is deposited on a side of the stencil 16 away from the PCB and is pushed through apertures or openings in the stencil onto solder pad sites on the PCB 12 by means of a squeegee (not shown), that traverses the stencil at an appropriate speed while exerting appropriate pressure. The stencil 16 is then lifted or actuated away from the PCB 12, leaving solder paste deposits on pad sites corresponding to the apertures in the stencil.

More specifically, in an illustrative in-line solder paste inspection implementation according to the invention, prior to closing the fixture (i.e. moving the stencil proximate to the PCB for printing), the vision system captures images of areas of interest on both the stencil and board (the side of the stencil facing the board being somewhat of a "mirror image" of the board side facing the stencil). Substantially simultaneously, the vision system captures images of fiducials on the stencil and board for alignment purposes, and images of sites that are subject to inspection on the stencil and the board. Further, after printing of the solder paste on the PCB the stencil is actuated away from the PCB and post-printing images of the stencil and the PCB are captured to effect the inspection process as described in detail hereinafter.

Inspecting a given stencil and a given board may involve multiple images depending on the image size, the stencil and board size and the number of sites on a stencil and board that the user wants to inspect. In typical usage, multiple sites on each of the stencil and the board are inspected. Therefore, capturing of an image on each of the stencil and the PCB, both before and after printing, is effected as many times as is necessary to capture images of each of the relevant sites on a particular board in a particular inspection cycle. In a typical PCB manufacturing process it is most expedient to "tile" the stencil and PCB into a plurality of sites so that only images of relevant portions of the stencil and PCB are captured during stencil and board inspection in a given cycle. Tiling minimizes memory storage requirements for a given substrate or board under inspection.

Furthermore, it is preferable that the tiles of the stencil and PCB be captured in a round-robin fashion so that not every site is inspected on a given board in a given cycle. That is, processing and fabrication line speed is enhanced when inspection according to the invention is implemented such that only a portion of all of the relevant sites are captured and inspected on a given board, while another portion of the relevant sites are inspected on a successive board and still another portion are inspected on still another board. In this manner, an inspection cycle (i.e. inspection of every site on a given board type) is effected over a plurality of boards under inspection. The round robin inspection in conjunction with tiling facilitates better statistical analyses.

In the illustrative embodiment of the invention described hereinafter, stencil inspection is described first, however, it should be appreciated that PCB inspection as described hereinafter can be effected prior to stencil inspection. In the present implementation it is preferable to consider the stencil first because certain efficiencies can be achieved in the training and inspection processes. For example, information obtained in a training process for inspection of the stencil can optionally be used in a training process for inspection of the board, as described in detail hereinafter. Similarly, information derived in a registration process for the stencil can be used as a starting point to simplify and enhance the registration process for the PCB in the PCB inspection process, also described in detail hereinafter.

Prior to undertaking any inspection of the stencil, the vision system must be trained, as known in the art. Training is handled "off-line", i.e. prior to any inspection run, and in the case of stencil inspection basically involves constructing a model of the stencil by identifying stencil characteristics based on a "golden sample" or known good stencil. The stencil characteristics identified during training are related to sites of interest, in this case apertures in the stencil corresponding to the locations of solder pads on the PCB. Training in this illustrative embodiment is effected using vision tools with training capabilities, such as Cognex Blob Analysis Tool, which runs on the vision system used in the inspection system.

Figure 2A:
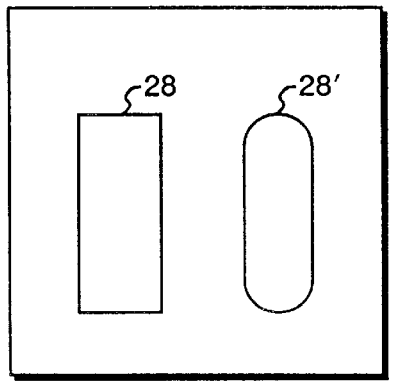
FIG. 2a is an illustration of stencil apertures corresponding to printing regions for receiving solder paste.

For each aperture 28, 28', such as illustrated in FIG. 2a, a data structure is constructed during training including a unique identifier for the aperture and characteristics of the aperture. Characteristics relating to and stored in association with each uniquely identified aperture include an aperture width, aperture height, and an X-Y location of the center of the aperture. For apertures with corner rounding (e.g. 28'), radial values indicative of curvature are also stored. When the Cognex Blob Analysis Tool is used for training, center of mass as determined by the Blob Analysis Tool as known in the art, is used as the X-Y location. Those skilled in the art will appreciate that median, mode or center of boundary box can also be used as the X-Y location.

Figure 2B:
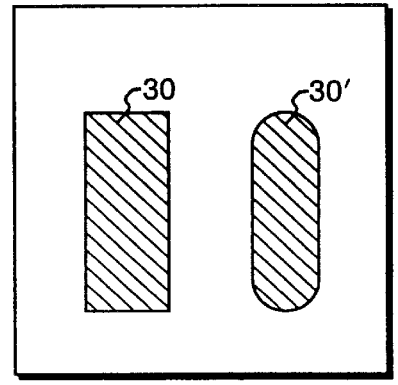
Figure 2C:
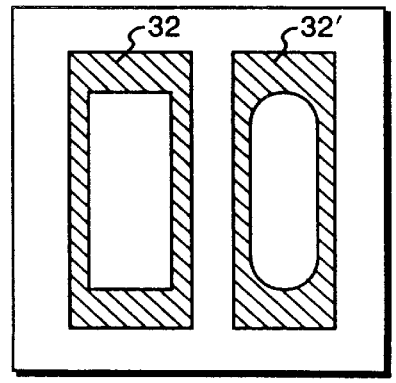

For each uniquely identified aperture a blockage region is specified during training, as illustrated in FIG. 2b. The blockage region 30, 30' is a region interior to the aperture 28, 28' which will be inspected for occlusion resulting from residual solder paste remaining on the stencil. Additionally, for each uniquely identified aperture a smear region is specified during training, as illustrated in FIG. 2c. The smear region 32, 32' is a region exterior to the aperture 28, 28' which will be inspected for the presence of solder paste resulting from residual solder paste remaining on the stencil.

Figure 2D:
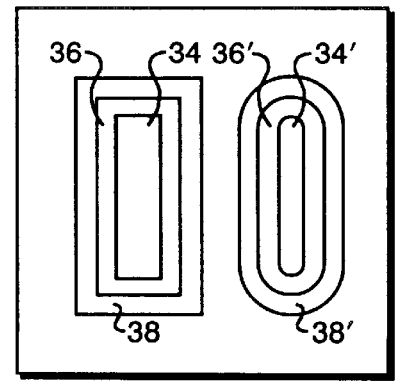
FIG. 2d is an illustration of runtime images of the apertures of FIG. 2a including the blocking regions of FIG. 2b and the smearing regions of FIG. 2c.

During a run-time inspection of the stencil as described in detail hereinafter, smearing and blockage might appear as illustrated in FIG. 2d. The extent of the open aperture 34, 34' may be impinged upon or restricted by blockage 36, 36' which will be detected as it resides within the specified blockage region. Likewise, smearing 38, 38' of solder paste will be detected on regions of the stencil exterior to the aperture which are within the specified smear region. Although not illustrated in FIGS. 2a–2d, the blockage region and smear region may be specified so as to incorporate a "don't care" region of several pixels between the outer edge of the blockage region and the inner edge of the smear region. Such a don't care zone is useful in that it removes from consideration the visual appearance at the stencil edge. The visual appearance at the stencil edge may be highly variable and extremely sensitive to lighting changes, squeegee position during printing, and aspects of the mechanical process used to form the aperture in the stencil.

Figure 3:
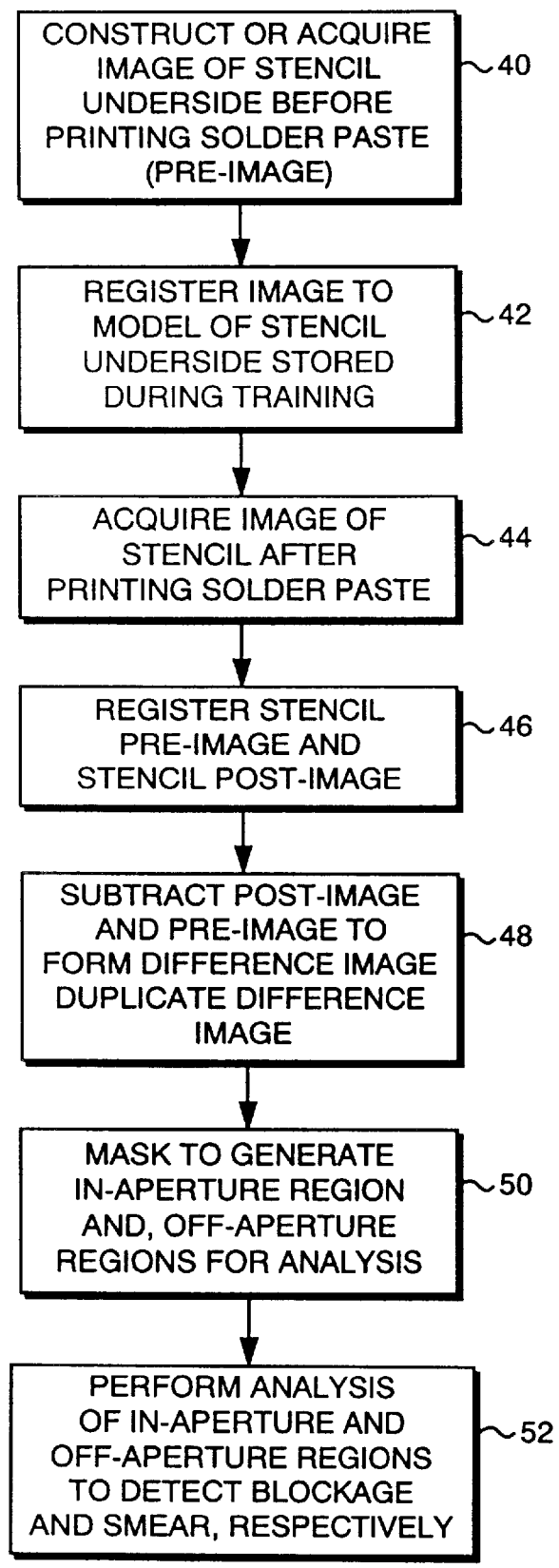
FIG. 3 is a flow diagram of process steps implementing stencil side inspection for a method and apparatus for in-line solder paste inspection according to the invention.

The stencil inspection process flow in the solder paste inspection procedure according to the invention is illustrated in FIG. 3. Initially an image of the stencil underside or side to be positioned adjacent to the PCB is acquired 40 before solder paste is printed, to obtain pre-printing image data (at times referred to herein as "stencil pre-image data"). The pre-image can be acquired immediately before printing a board in-process or it can be obtained well in advance of the screen printing process. While the pre-printing image or pre-image data in this illustrative embodiment is acquired in-line using the camera and optics available for registration of the stencil and PCB, as discussed hereinbefore, the data can be acquired as data files from automated machinery used to fabricate the stencil (or PCB). Similarly, the pre-image data can alternatively be synthesized from a geometric description of the stencil, including information about the location and size of each aperture, combined with calibration information required to calibrate the geometric description of the stencil to pixel size(s) and aspect ratio(s) of the camera imaging system that is used to acquire post-printing image data.

Inspecting a stencil may involve multiple images depending on the image size and stencil size and the number of sites on a stencil that the user wishes to inspect, thus acquisition or construction of stencil pre-image data is effected for each site on a stencil that is to be inspected. Subsequent steps in the inspection process are performed as many times as necessary to effect inspection of each site for which pre-image data (and post-image data) is acquired.

The image acquired by the camera imaging system is registered 42 to the model of the stencil stored during training. This initial registration effectively aligns the selected sites where the apertures are on the stencil image acquired before printing (the pre-image), with the selected sites of the apertures on the model stencil image stored during training. Registration compensates for any differences in the coordinate systems of the respective acquired images. This initial registration is accomplished by performing two one-dimensional registrations, one in the X and one in the Y, on projections, as known in the art, of the model and stencil images. Registration is achieved when there is maximum correlation between the projections in each dimension. The initial registration can alternatively be effected by vision tools known in the art, such as described in U.S. Pat. No. 5,548,326 entitled EFFICIENT IMAGE REGISTRATION which is incorporated herein by reference. Registration can be implemented as well, with other vision tools using fiducials on the stencil.

After the pre-image data is acquired and after registration of the pre-image and the model image, printing of the solder paste can be effected.

Thereafter, the camera acquires an image of the stencil underside after solder paste 44 has been printed on the circuit board (the "stencil post-image"). The stencil post-image corresponds to the same stencil or section of stencil that was acquired before the screen printing of the solder paste.

The stencil pre-image and the stencil post-image are then registered to one another 46. Registration of the pre-image to the post-image can have several degrees of freedom, such as translation (2 degree), rotation, scale, skew, etc. In the present implementation, rotation, scale and skew are minimized and registration (both pre-image to model image and pre-image to post-image) is effected for translation only. A preferred method for pre-image to post-image registration is to use the technique of Efficient Image Registration (U.S. Pat. No. 5,548,326) which can align two images of an object that has undergone a manufacturing process. However, other techniques such as Cognex's Normalized Correlation Search tool, Cognex's Caliper Tool, or Cognex's CNLPAS tool could also be used to align the two images. It should be appreciated that pre-image to post-image registration works best if there are no changes in lighting between acquisition of the respective images.

The registration step 46 allows information from the bare stencil (pre-image) to be combined with information from the stencil after screen printing with paste (post-image). The two aligned images, i.e. the pre-image and the post-image, can be effectively combined by optionally subtracting one from another 48 yielding a difference image with pixel values that are signed quantities (i.e. positive or negative). The positive value of pixels in the difference image represent blockage when those pixels appear in the blockage region of the aperture. The negative value pixels represent smear when those pixels appear in the smear region.

The difference image is then separated into two images for separate processing of positive value pixels and negative value pixels. An expeditious method of separating the difference image is to duplicate the image to form a positive value image and a negative value image, and then replace all of the negative pixels in the positive value image with dont cares (i.e. zeros) and replace all of the positive value pixels in the negative value image with don't cares. All pixels in the negative image can then be replaced with their absolute values for mathematical convenience, and the positive value image and the absolute value image can be separately processed.

The subtraction step 48 is optional because it may not be necessary to subtract and obtain a difference image (representative of difference in gray value) in order to clearly distinguish locations where there is paste from locations where there is no paste. In situations where there is significant contrast in color (and consequently significant disparity in gray value) between paste and non-paste areas, a binary image can be generated based on discriminating one gray value (or range of gray values) as representative of paste and another gray value (or range) as representative of other than paste, i.e. stencil background. The alignment effected by registration between the pre-image and the post-printing binary image clearly indicating paste locations, facilitates detection of paste in the blockage and smear regions (defined during training).

The difference image (if necessary) or the binary image contains information clearly indicative of the location(s) of solder paste on the stencil or in the aperture(s). It is desirable to separately process aperture information in order to detect blockage and stencil background information in order to detect smear. A mask is generated using stencil training information to define in-aperture and off-aperture regions. It should be appreciated that the mask can also be generated by thresholding the pre-image. The mask is applied 50 to the difference (or binary) image to mask out the aperture area from the stencil background area so that those two groups of image regions can be processed separately.

Analysis of the in-aperture region and the off-aperture region 52 can then be effected by using a connected components analysis as known in the art. Alternatively, Cognex's Blob Analysis Tool can be used to measure paste distribution on the stencil. Cognex's Blob Analysis Tool provides information such as area, center of mass, orientation, moments, and extent. In this illustrative embodiment, area measurements of blockage and smear are the measurements of primary interest. The regions of interest for applying the Blob Analysis Tool are the registered stencil openings for paste blockage and around the stencil openings for paste smearing. The exact locations of the openings are known because the aperture locations are known from the pre-image acquired before screen printing and the relative position changes of the apertures are known from the post-image acquired after solder paste screen printing.

Printed circuit board inspection described in detail hereinafter is effected in a substantially similar manner as the stencil inspection described in detail hereinbefore.

As with the stencil, prior to undertaking any inspection of the PCB, the vision system must be trained, as known in the art. Training for the PCB is also handled "off-line" prior to any inspection run. Like in the case of stencil, PCB training basically involves constructing a model of the PCB by identifying PCB areas of interest and characteristics. The PCB characteristics identified during training are related to sites of interest, which in the PCB case are solder pads corresponding to apertures in the stencil.

As with the stencil side, PCB inspection training is effected by acquiring an image of a known good entity, in this case a PCB, and constructing a model of characteristics of interest, in this case solder blobs on solder pads. Generally, PCB training is used to define a model image based on a registration window within a field of view. The model of the PCB constructed during training will result from consideration of where the solder is supposed to go as defined by a baseline location of the pads of interest and location(s) on the pad where solder is properly deposited.

As with the stencil side training, training for the PCB in this illustrative embodiment is effected using vision tools with training capabilities, such as Cognex Blob Analysis Tool, which runs on the vision system used in the inspection system.

For each registration window selected within a field of view, a data structure is constructed during training including a unique identifier for the pads of interest. Further, characteristics for each of the pads are stored in the data structure in association with the pads unique identifier, including: the pad's width, height, X-Y location, and any corner curvature information. As with the stencil training procedure, PCB training for pad information is effected using a vision tool such as Cognex's Blob Analysis tool or other vision tool having training capabilities as known in the art.

In addition to information relating to the pads, training for the printed circuit board inspection may involve gathering information relating to solder bricks or blobs deposited on a known good PCB. In such a case, where certain of the information relating to the solder is a function of characteristics of the stencil used to deposit the solder, the efficiency of the process can be enhanced by using, in the training for the PCB, certain information obtained in training for the stencil. Specifically, a given solder brick can be identified and correlated to a known aperture on the stencil already trained for. Width and height information for respective apertures can be used as width and height information for corresponding solder depositions in training for the PCB. Similarly, the X-Y location of the respective apertures can be used for a starting point for determining the X-Y location of the corresponding pads in gathering characteristics or training for the PCB. The training process for the PCB may be implemented to utilize virtually all of the characteristics relating to and stored in association with each uniquely identified aperture, including the aperture width, aperture height, and X-Y location, and for apertures with corner rounding the radial values indicative of curvature can be used. It should be appreciated that the training information relating to the stencil is a "mirror image" of the information as it would relate to the PCB, therefore in order to use the stencil information it must be processed accordingly. It should also be appreciated, as previously mentioned, that training for the PCB can be done as with the stencil, by using a vision tool such as Cognex's Blob Analysis tool or other vision tool having training capabilities as known in the art.

Figure 4:
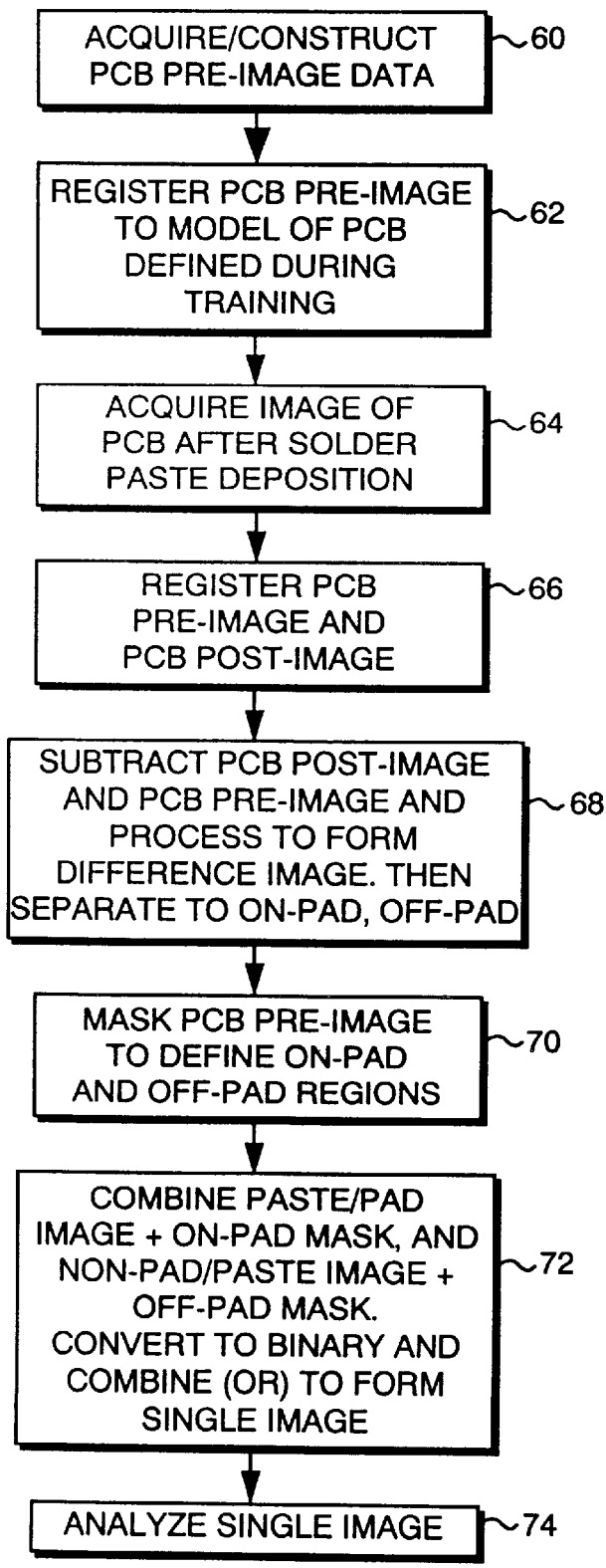
FIG. 4 is a flow diagram of process steps implementing printed circuit board side inspection for a method and apparatus for in-line solder paste inspection according to the invention.

The PCB inspection process flow is illustrated in FIG. 4. Initially an image of the PCB is acquired 60 before solder paste is printed, to obtain pre-printing image data (at times referred to herein as "PCB pre-image data"). As with the stencil, the image can be acquired immediately before printing a board in-process or it can be obtained well in advance of the screen printing process. While the pre-printing image or PCB pre-image data in this illustrative embodiment is acquired in-line using the camera and optics available for registration of the stencil and PCB, as discussed hereinbefore, the data can be acquired as data files from automated machinery used to fabricate the PCB, as known in the art.

Inspecting the PCB, as with the stencil, may involve multiple images depending on the image size and board size and the number of sites on the board that the user wishes to inspect. Thus acquisition or construction of PCB pre-image data is effected for each site on the board that is to be inspected. Subsequent steps in the inspection process are performed as many times as necessary to effect inspection of each site for which pre-image data (and post-image data) is acquired.

The pre-image, acquired by a camera imaging system, is registered 62 to the model of the PCB stored during training. This initial registration effectively aligns the selected sites of interest on the PCB image acquired before printing (the pre-image), with the selected sites of interest on the model PCB image stored during training. This initial registration can be efficiently undertaken using a vision tool effecting normalized correlation as known in the art, which allows linear changes in brightness to be ignored when registering the model to the pre-image. As with the initial registration in the stencil inspection, initial registration in the PCB inspection can be implemented as well, with other vision tools using fiducials on the stencil. Similarly, the initial registration can be effected by vision tools known in the art, such as described in the referenced U.S. Pat. No. 5,548,326 entitled EFFICIENT IMAGE REGISTRATION.

After the pre-image data is acquired 60 and registered 62, printing of the solder paste on the PCB can be effected.

After solder paste has been printed on the circuit board, the camera acquires an image of the PCB (the "PCB post-image") 64. The PCB post-image corresponds to the same PCB or section of PCB that was acquired before the screen printing of the solder paste.

The PCB pre-image and the PCB post-image are then registered to one another 66. Again, a preferred method for pre-image to post-image registration is to use the technique of Efficient Image Registration (U.S. Pat. No. 5,548,326) which can align two images of an object that has undergone a manufacturing process. However, other techniques such as Cognex's Normalized Correlation Search tool, Cognex's Caliper Tool, or Cognex's CNLPAS tool could also be used to align the two images. The registration step 66 allows information from the PCB before printing (PCB pre-image) to be combined with information from the PCB after screen printing with paste (PCB post-image).

The two registered or aligned images, i.e. the PCB pre-image and the PCB post-image can be effectively combined by optionally subtracting one from another 68 yielding a difference image with pixel values that are signed quantities (i.e. positive or negative). Since solder paste is generally darker than printed circuit board pads and brighter than printed circuit board background, the positive value pixels in the difference image represent solder paste on the pads and the negative value pixels represent solder paste off the pads and on the printed circuit board background. Zero value pixels may result in the difference image, which represent either locations without solder paste or locations where the solder paste happens to have the same gray value as the printed circuit board proximate to it. Zero value pixels are "don't care" pixels, i.e. of no interest.

The difference image is then separated into two images for separate processing of positive value pixels and negative value pixels. An expeditious method of separating the difference image is to duplicate the image in order to form a positive value image and a negative value image. This is accomplished by replacing all of the negative pixels in the positive value image with don't cares (i.e. zeros) and replacing all of the positive value pixels in the negative value image with dont cares. All pixels in the negative image can then be replaced with their absolute values to form an absolute value image. Thus the positive value image constitutes a solder paste/pad image representative of solder paste on pads and the absolute value image constitutes a non-pad/paste image representative of solder paste off the pads and on the printed circuit board background.

As with the stencil side processing, the subtraction step 68 is optional because it may not be necessary to subtract and obtain a difference image (representative of difference in gray value) in order to clearly distinguish locations where there is paste from locations where there is no paste. In situations where there is significant contrast in color (and consequently significant disparity in gray value) between paste on pad and non-pad/paste areas, a binary image can be generated based on discriminating one gray value (or range of gray values) as representative of paste on pad and another gray value (or range) as representative of other-than-pad paste areas, i.e. PCB background. The alignment effected by registration between the pre-image and the post-printing binary image clearly indicating paste locations, facilitates inspection and detection of paste locations (as defined during training).

Figure 5A:
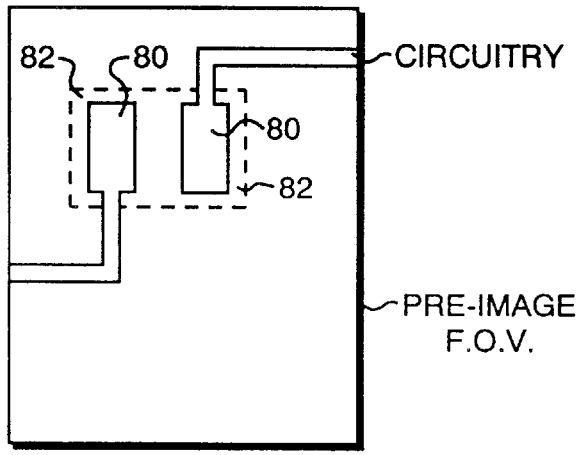
FIG. 5a is an illustration of a pre-image with defined on-pad regions and off-pad regions.

The difference images (if necessary) or the binary image contains information clearly indicative of the location(s) of solder paste. It is desirable to mask out the pads from the PCB background so that it is possible to separately process pad information and non-pad or background information. That is, for purposes of further processing and analysis to determine the location of solder on pads and the location of solder off of the pads (likely causing bridges between fine pitch or closely spaced pads), masks are used to select out and independently process pad information and PCB background information. A mask is generated and applied 70 using PCB training information to define on-pad regions 80 and off-pad regions 82 as illustrated in FIG. 5a. Masking in this illustrative embodiment is based on the relative gray value of areas of the PCB, and is accomplished by setting a threshold on the PCB pre-image and designating all pixels in that image having a gray value greater than (or equal to) the threshold to be on-pad regions 80, and designating all pixels with gray values less than (or equal to) the threshold to be off-pad regions 82. Optionally, a connected components analysis as known in the art can be effected on the on-pad regions to ensure that the pads are a minimum size.

Figure 5B:
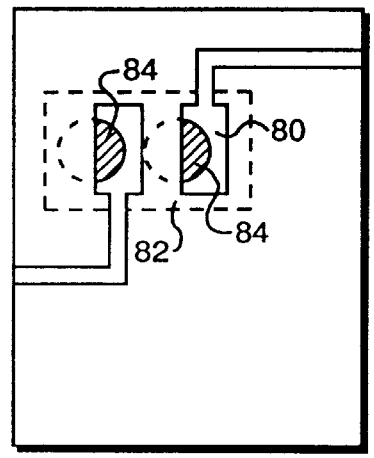
FIG. 5b is an illustration of an on-pad difference image representative of the position of solder paste on solder pads.
Figure 5C:
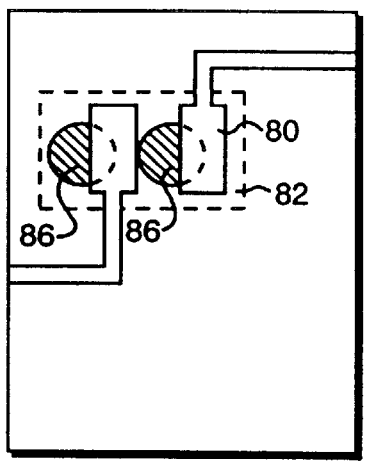
FIG. 5c is an illustration of an off-pad difference image representative of the position of solder paste on areas of the board other than the pads.

In a combining operation 72, the on-pad mask is logically ANDed with the solder paste/pad image to form an on-pad difference image, illustrated in FIG. 5b, representative of the position of solder paste on the pads 84. The off-pad mask is logically ANDed with the non-pad/paste image to form an off-pad difference image, illustrated in FIG. 5c, representative of the position of solder paste on areas of the board other than the pads 86.

The on-pad difference image and the off-pad difference image are converted, using thresholding operations with different respective thresholds, to respective first and second binary images. The thresholds are locally adjusted, that is, every pixel in the image has its own threshold, based on the pre-image, so that when the pre-image gray scale value is nearer to the paste gray scale value the threshold is (linearly) smaller. The paste gray value is determined by statistically sampling known paste pixels at runtime.

In the present illustrative embodiment, the off-pad thresholds are calculated as a fraction of the filtered post-image and the on-pad thresholds are calculated as a fraction of the filtered pre-image, i.e. the gray scale values of each pixel in the respective image are each multiplied by a fractional value. The fractional values are determined empirically such that the locally calculated thresholds will be effectively empirically derived as a function of the lighting, type of paste, board color and factors affecting the vision system. The thresholds can be calculated locally based on a fraction of the pre-image or a filtered pre-image gray scale value. Local thresholding is described in detail in commonly owned, copending U.S. patent application Ser. No. 08/716, 779 (Atty Docket No. C96-015) filed Sep. 24, 1996 by Nichani entitled SYSTEM OR METHOD FOR DETECTING DEFECTS WITH A SEMI-OPAQUE ENCLOSURE, which is incorporated herein by reference. Alternatively the thresholds can be an empirically derived fixed quantity.

Figure 5D:
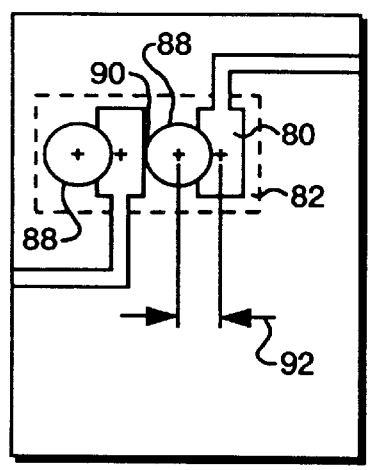
FIG. 5d is an illustration of an image representative of solder paste on the printed circuit board.

The respective first and second binary images are in turn combined by a logical OR operation to form a single binary image, illustrated in FIG. 5d, representative of solder paste 88 on the printed circuit board.

The single binary image is then analyzed 74 using a connected components analysis method as known in the art, or by using a known vision tool to measure paste distribution and/or to determine information regarding the solder paste, such as area, center of mass, orientation, etc. From the paste area distribution and two sets of image registrations, other useful quantities can be derived, as known in the art, such as indications of bridging between solder blobs and print offset(s).

Bridging 90, the misplacement of solder in a manner that results in an erroneous electrical connection between adjacent pads or between a pad and conductive surface proximate thereto as illustrated in FIG. 5d, is determined by calculating the boundary of the paste region and measuring its proximity to neighboring pads.

Print offset 92, also illustrated in FIG. 5d, is a deviation in position between where the paste was actually printed relative to where it was supposed to be printed as defined at training time. There are two sets of information generated relating to two "types" of print offset in the system according to the invention.

A first print offset calculation relates offset of the center of mass of each of the individual solder blobs to the center of mass of its respective or corresponding solder pad, determining offset therebetween. The first print offset calculation makes available an offset for each of the individual solder blobs.

A second print offset calculation determines an aggregate offset of all of the solder paste blobs inspected relative to where they are supposed to be printed on their respective solder pads. The second print offset calculation effectively correlates a synthesized, mirrored stencil image to the single binary image representing solder on the board, enabling a "global" view of the results of the printing process. Such an aggregate view can be achieved as well by taking an average of all of the individual offsets determined according to the first print offset calculation(s).

Again, Cognex's Blob Analysis Tool can be used to measure paste distribution on the PCB. Cognex's Blob Analysis Tool provides information such as area, center of mass, orientation, moments, and extent. Illustrative regions of interest for applying the Blob Analysis Tool on the PCB are the registered solder pads and center of mass of the solder blobs for detecting print offset, and around the solder pads, i.e. between adjacent solder pads for detecting bridging. The exact locations of the pads are known from the pre-image acquired before screen printing and the relative position of the solder paste to the pads is known from the post-image acquired after solder paste screen printing.

It should be appreciated that vision tools implemented in conjunction with the inspection methodology described hereinbefore can be used to inspect for various other aspects related to the screen printed material, i.e. other than bridging and print offset, such as dross presence (i.e. extra paste not associated with any solder pad deposition), total paste coverage or the like.

Those skilled in the art will appreciate that some, or all, of the steps of subtraction, masking, thresholding, ANDing and ORing described hereinbefore can be combined and effected as hardware implementations, software implementations or a combination thereof, and that although a vision system is described implemented with a Cognex vision system and vision tools, the invention can be implemented on other platforms, such as general purpose computers running software and/or configured with hardware to effect the functionality described herein.

The local thresholding described herein can also be accomplished in various ways, such as by taking the square root of the pre-image, or by computing some linear or non-linear function of a respective image (i.e. model image, pre-image or post-image), or by using a constant.

It should be further appreciated with respect to the foregoing, that it is not necessary to acquire pre-printing image information before every printing operation and that a database of information can be stored and accessed to obtain pre-printing image information. The database of information can be from a captured image, downloaded from a Computer Aided Design tool or otherwise acquired. Likewise, for purposes of efficiency and expediency it is not necessary to acquire a post-printing image after every printing operation. Post-printing information can be acquired periodically, as necessary to keep the process within some appropriate user defined control limits.

While the system described herein acquires and stores an entire pre-image it will be appreciated that instead of storing an entire pre-image portions of an image constituting useful information can be stored and used to synthesize a pre-image during runtime. Similarly, limited useful information from the captured pre-image, such as a gray level histogram, can be stored and used to determine gray levels in the post-image for binarizing.

Additionally, while two aligned images, i.e. the pre-image and the post-image, are described herein as being effectively combined by optionally subtracting one from another yielding a difference image with pixel values that are signed quantities (i.e. positive or negative), it should be appreciated that analogs of the pre and post images, such as filtered or re-mapped images can be processed and combined to yield a "difference image" that has unsigned pixel values.

Furthermore, while other operations are described herein utilizing the pre-image and the post-image, it should be appreciated that any of the images described herein can be subject to further processing, such as by filtering using a gaussian filter, median filter, smoothing filter, morphological filter or the like known in the art, in order to improve image quality.

Although a training process is described herein using a specified, known in the art vision tool (i.e. Cognex Blob Analysis Tool) for obtaining characteristics relating to the apertures for the stencil side inspection and the solder pads for the PCB side inspection, it should be appreciated that a data base of information relating to the characteristics of the stencil and the board can be obtained using other vision tools, such as Cognex Caliper Tool or from a CAD tool or other machinery that requires or acquires and has information relating to the characteristics of interest, such as automated tooling used to cut the stencil or other tooling used to fabricate the PCB. Alternatively, training information can be manually obtained by an operator and entered into the system.

It will be appreciated that although the invention described in an illustrative embodiment herein effects inspection of solder paste applied to printed circuit boards, it can be similarly implemented in processes to effect inspection of other materials such as screen printed adhesives, conductive adhesives or the like, applied on substrates other than printed circuit boards. Furthermore, although the invention is described in an "in-line" implementation with a screen printing process, the invention can be implemented and/or the inventive concepts herein modified to be used to inspect solder paste or adhesives applied in other ways. That is, efficient, robust inspection can be effected as described hereinbefore using a before image and an after image, regardless of how the material added to the after image is applied.

While the method and apparatus described herein use a masking operation that involves application of a threshold to a pre-printed image to form on-pad and off-pad masks, it should be appreciated that other means of masking or mask generation can be implemented in order to distinguish between the areas of interest and other areas that may be inspected.

Although in the method and apparatus described hereinbefore on-pad and off-pad images are described as logically ANDed with respective masks, and two threshold difference images are described as logically ORed to effect a single binary image, it will be appreciated that other means of combining the respective images can be effected to arrive at images or an image representative of the logically combined images.

The previous embodiments registered a stored pre-application image to a post-application image for each inspection. For each inspection site, a pre-application image is stored in memory. The memory space required to store the pre-application images limits the number of sites a user can inspect, where each site can contain more than one region of interest, e.g. solder pads.

Figure 6:
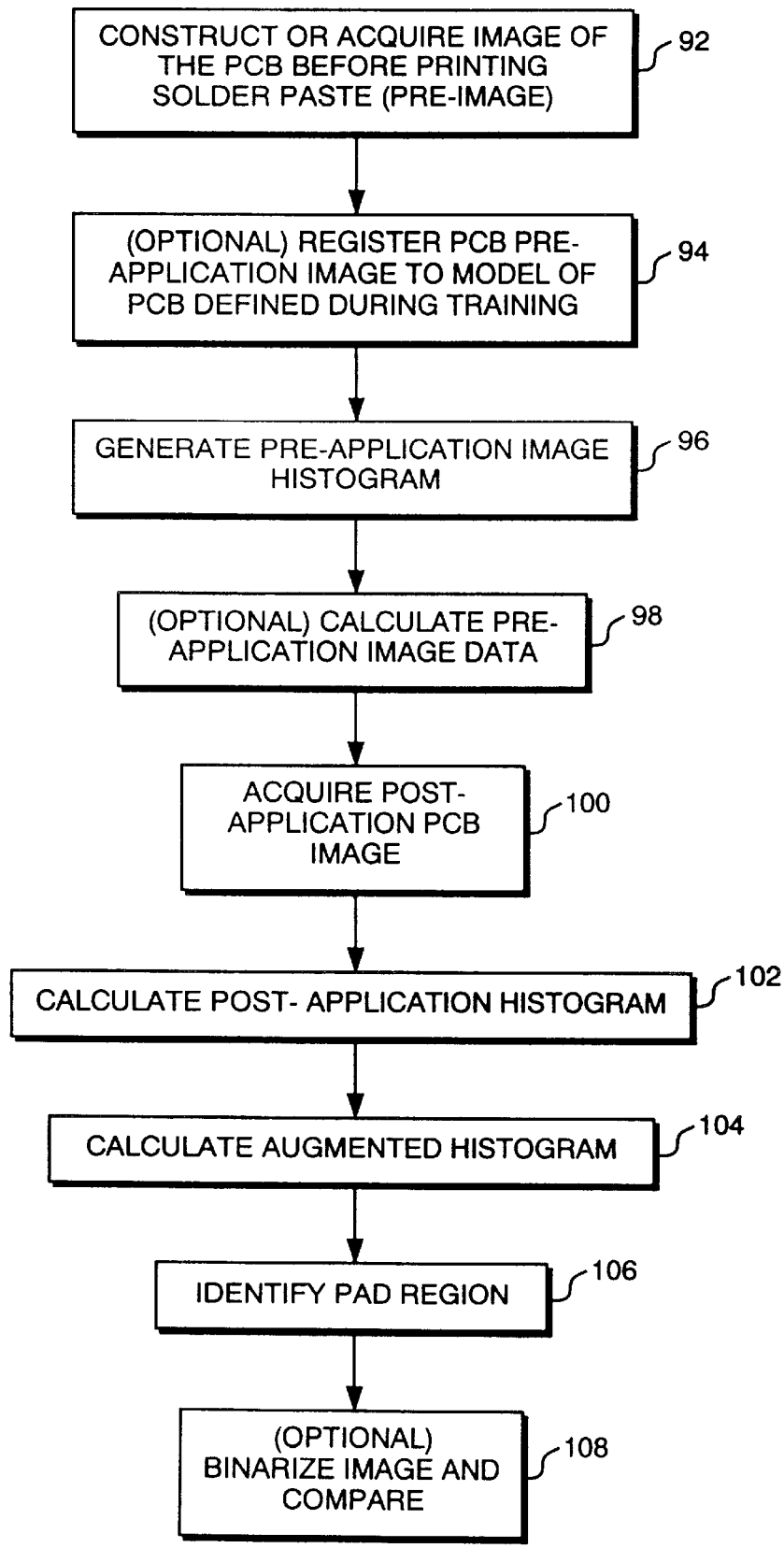
FIG. 6 is a flow diagram of process steps implementing printed circuit board side inspection for an embodiment of the method and apparatus for in-line solder paste inspection according to the invention.

FIG. 6 illustrates an alternate PCB inspection process flow that decreases the memory requirements by calculating and storing characteristics of the pre-application image as a one-dimensional image (i.e. histogram) instead of storing the two-dimensional pre-application image, where like numerals designate like steps. The first step is to acquire/construct the pre-application image of the PCB prior to application of the solder paste 60.

Thereafter, a pre-application histogram of the pre-application image is generated 96. A histogram is a one-dimensional array of values representing the distribution of gray values of the pixels in the image. Each of the pixels is mapped into a bin, graphed on the x-axis of the histogram, having the same index as the gray value of the pixel. The value of each bin indicates the number of pixels in an image that have a gray value substantially identical to the index of that bin.

Using the pre-application histogram, information about the pad regions is determined. Analysis of the pre-application histogram is effected using vision tools with peak detection abilities as known in the art. For instance, assuming that the brightest peak corresponds to the pad region, a peak corresponding to the pad region is identified and then analyzed with other known techniques, such as integration, to estimate an area of the pad region or other characteristic information.

However, a preferred embodiment enhances the utility and reliability of the pre-application histogram prior to analyzing the pre-application histogram by using an optional model. The enhanced reliability of the pre-application histogram also enhances the reliability of the characteristics extracted from the pre-application histogram.

The method enhances the pre-application histogram by using a model of the pre-application image to define the site of the pre-application image before calculating the pre-application histogram. The model of the pre-application image, defined during training as hereinbefore described, is registered to the pre-application image 94. The registration aligns selected sites where the pads are on the PCB. Registration is accomplished as previously described. Thereafter, the sites are windowed and a histogram of each pad of the site (i.e. each pad of the pad region 80) is generated.

The histograms for each pad are then summed to create a single pre-application histogram for each inspection site. The histograms are summed by adding the number of pixels with a 0 index from each pad histogram and assigning the sum as the value of the bin in the pre-application histogram with a 0 index. All pixels in the histogram with index of 1 are summed and stored in the pre-application histogram with index of 1. The summing process is continued until all the intensity values for each pad are appropriately represented in the pre-application histogram. The resulting pre-application histogram reflects pixel gray values for all the pads of the inspection site without pixel gray values corresponding to the PCB region (off-pad regions 82). The entire PCB, each pad or each site can be processed or grouped in this manner.

In a preferred embodiment, the area of the pad region is calculated and used to aid identification of the pad regions in the post-application image. Accordingly, in addition to calculating the pre-application histogram 96, the area of the pad region is calculated as the number of pixels in each pre-application histogram times the area of each pixel 98. The number of pixels includes all pixels represented in the pre-application histogram regardless of intensity value. It will be appreciated that the area of the pads can be found using other methods known in the art, such as a connectivity analysis of the sites of the pre-application image.

The pre-application histogram and pad region areas, if calculated, are stored for each inspection site before the paste is applied on the PCB. Optionally, if more accuracy is desired, the calculated pre-application histogram data updates the model and the updated model is also stored.

After solder paste is printed on the PCB, the camera acquires an image of the PCB (the post-application image) 100 at all relevant sites as previously described with reference to the registration embodiments of FIGS. 1–5.

The previously described embodiments relied upon proper registration of the post-application image to the pre-application image to minimize errors within the difference image. The necessity of proper registration is minimized in this embodiment. Preferably, the location of the post-application image corresponds to the location of the pre-application image. However, the pad regions do not have to be located precisely in the post-application image because the pad regions are not optionally windowed as they were in the pre-application image or registered to the pre-application image as required in the previous embodiments.

However, the entire pad region should be within the post-application image so the entire pad region can be inspected and/or the calculated pad area can be used to assist the identification of the pad regions. To that end, the size of the window for each site of the post-application image is increased to account for errors in repeatability of the camera positioning mechanism, where the means to increase the window size is known in the art.

A post-paste application histogram is constructed of the post-application image within the window 102.

The post-paste application histogram of a PCB typically contains an unknown number of peaks because the off pad region's color varies and reflects light in different manners as previously described. Further, if paste is present, the post-paste application histogram also typically contains an poorly defined boundary between the paste region and the pad region.

The invention determines the paste/pad boundary, if present, by augmenting the post-paste application histogram of the post-application image (i.e. second-state image) using the pre-application histogram of the same inspection site. In a preferred embodiment, the invention enhances the representation of the pad region relative to the paste region thereby making the paste/pad boundary more pronounced 104.

It should be apparent that another region, that is also present in the pre-application image, can be enhanced within the post-paste application histogram, and that the choice of the region, such as the pad region, depends upon the requirements of the application. The processing of and the optional use of the model would also have to be tailored to each application.

Figure 7A:
FIG. 7A is an illustration of a pre-paste application histogram of a windowed pad region in a pre-application image of a PCB.
Figure 7B:
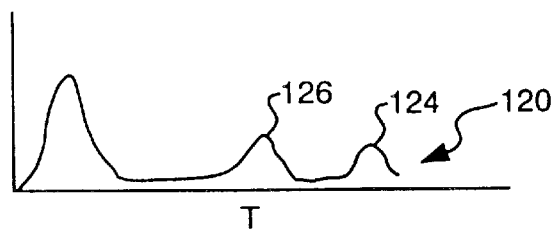
FIG. 7B is an illustration of a post-application histogram of a PCB after application of paste.
Figure 7C:
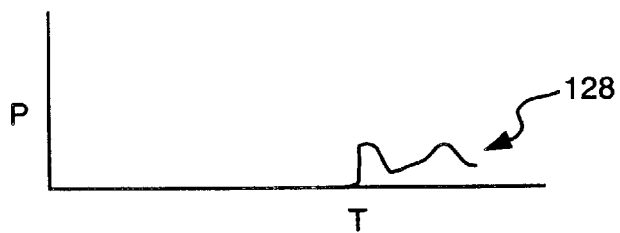
FIG. 7C is an illustration of an augmented histogram generated by removing the intensity values of the off-pad regions from the post-application histogram of FIG. 7B.

One manner of enhancing the representation of the pad region is to remove the pixels in the post-paste application histogram that are not within the area of the pad region in the first-state image, as is more fully described with reference to FIGS. 7A–7C. The intensity values are removed by reassigning the intensity values of the non-relevant pixels to zero or "do-not-care" labels. To determine which intensity values are reassigned within the post-paste application histogram 120, the number of pixels are summed starting from the highest intensity value to the lowest intensity value (i.e. from right to left in FIG. 7B).

It is assumed that the pads and the paste are bright and therefore correspond to high intensity values. With reference to FIGS. 5A–5C, typically, the pad region 80 is the brightest and corresponds to the right most peak 124 of the post-paste application histogram 120. Also, typically the paste regions 84 and 86 are brighter than the off-pad regions 82 but not as bright as the pad regions 80. Therefore, the paste regions 84 and 86 typically correspond to the second right-most peak 126.

Accordingly, when the number of pixels within the post-paste application histogram 120 correspond to the area of the pads (as calculated at step 96 during the pre-application calculations), the paste/PCB intensity value boundary is defined, such as T for example. Any pixels having an intensity value below the boundary, T, are set to zero and the resulting augmented histogram 128 is shown in FIG. 7C. Using the assumption that the highest gray values correspond to the pads or the paste, the intensity values remaining within the augmented histogram 128 correspond substantially only to pad and/or paste pixels. If the paste is absent, the boundary will be the pad/PCB region boundary and only contain the right most peak 124. This is one way in which the 0% coverage of paste is detected by the invention.

By keeping only the pixels substantially equal to the pad area given by the pre-application histogram, the number peaks within the post-paste application histogram is reduced from n substantial peaks to two substantial peaks, if paste is present, or one, if paste is not present. Reducing the number of peaks to a known quantity is a necessary prerequisite before applying most known thresholding techniques. Typically thresholding techniques reply upon knowing the number of peaks present in each signal prior to determining the threshold. This is particularly useful for PCB inspection because histograms of PCBs often contain an unknown number of peaks. For example, a PCB having a pattern, such as a manufacture's logo, and a PCB of different colors, can be processed regardless of the varying intensities of the off-pad region using the area of the pad region from the pre-application histogram.

Figure 7D:
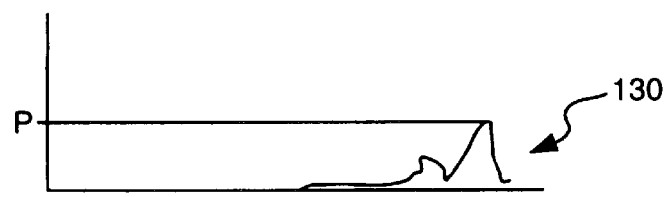
FIG. 7D is a representation of an augmented histogram generated by selectively combining the pre-paste application histogram of FIG. 7A and histogram of FIG. 7C.

In a preferred application, not only are the pixels outside of the pad area removed from the post-paste application histogram, but also the peak of the pad region is enhanced by selectively combining the intensity values of the pre-application histogram to the post-paste application histogram or the augmented histogram. FIG. 7A is an instance of a pre-application histogram 122 generated from summing histograms of windowed pads. The pre-application histogram 122 is selectively combined with the augmented histogram 128 of the post-paste application histogram 120 by comparing bins of both histograms that have the same index. In a preferred embodiment, a new augmented histogram 130 is created wherein each bin contains the maximum value of either the pre-application histogram 122 or the augmented histogram 128 for the same index as shown in FIG. 7D. The augmented histogram 130 has a substantially bimodal distribution, which as stated earlier is easier for common algorithms to threshold.

The intensity value of the pad region increases within the augmented histogram to indicate presence of paste on the pad regions of the post-application image. However, if the intensity values of the pad region do not change after the combination procedure, the second-state image has either a pad region that is brighter or has the same brightness as the first-state image. If the brightness is the same, then 0% coverage of paste is indicated. It should be apparent that comparing the change or lack thereof of the augmented histogram compared to the second-state histogram provides information about the second-state image without further processing.

An alternate method of combining the pre-application histogram and the post-paste application histogram is by summing both histograms regardless of the maximum values. The intensity value within the resulting augmented second-state histogram increases relative to at least one other region because the intensity values is the sum of the intensities of the first region from both the pre-application histogram and the post-paste application histogram.

Those skilled in the art should appreciate that the technique of selectively combining the pre-application histogram with another histogram can be used alone or combined with the removal of intensity values of histogram described with reference to FIG. 7C. For instance, combining the histograms without eliminating the pixels associated with the off-pad regions can enhance the relevant peak. Similarly, reassigning of the intensity values of part of the pixels can also be used alone or in conjunction with selectively combining the histograms to enhance the relevant region.

After the augmented histogram is calculated, the pad region in the post-application image is identified within the augmented histogram 106. A preferred method for identifying the region is to define a binarizing threshold of the pad/paste region using the within-group variance method. The within-group variance method is a technique well known in the art and is further described in Ostu, A Threshold Selection Method from Gray-Level Histogram, IEEE Trans. Systems Man. Cybernet, (1987) SMC-8, 62–68, incorporated herein by reference. However, those skilled in the art should appreciate that any statistical thresholding technique using histograms can be used.

Although the preferred embodiment described separating paste regions from pad regions, one skilled in the art should appreciate that one signal can be processed multiple times to selectively eliminate different portions of the post-paste application histogram and/or selectively enhance an unpronounced intensity value of the post-paste application histogram using the pre-application histogram and optional training information. For instance, a pattern on the substrate, such as lettering identifying the manufacturer, can be identified from the background, paste and pad regions.

Further, those skilled in the art should appreciate that a bimodal signal can be generated from any object having two or more states (pre-application characteristics and post-paste application characteristics) using the method of this embodiment.

Returning to FIG. 6, to further the evaluation of other aspects of the second-state image, a binary image is created 108 using the threshold identified in step 106. A soft threshold is used in the preferred embodiment to map the binary image. The soft threshold is achieved by creating a pixel map such that there are two thresholds above and below the one calculated previously, the center threshold. The thresholds are chosen such that n percent of the pixel area is between the low threshold and the center threshold, and n percent of the area is between the high threshold and the center threshold. All pixels above the high threshold are mapped to 255 and all pixels below the low threshold are set to 0. All values in between are divided into equal increments such that the mapping values will transition from the low to the high value in a straight line. This is a soft threshold where pixel values that are bordering the threshold are partially counted. The post-application image is then mapped using this pixel map.

In the preferred embodiment, to facilitate the identification of regions in the post-application image other than the pad region remaining in the post-application image, the mapped image is registered to the optionally generated model of the inspection site, similar to step 94. With the aligned model and binary image, the pad region or any modeled region can be identified and compared to the binary image. Once the pads are located, the pixels in each pad region window are counted to determine the amount of pad area remaining after application of the paste. The amount of pad covered by paste is then calculated by comparing the area of pad in the binary image to the pad areas calculated from the pre-application image. Both the 0% and 100% paste coverage instances are properly identified by the method.

Alternatively, Cognex's Blob Analysis Tool can be used to identify the pad region, where Cognex's Blob Analysis Tool provides information such as area, center of mass, orientation, moments, and extent.

Other information can be identified within a second-state image by manipulating the model, the first-state histogram, and the second-state histogram using the method of the invention.

Although a preferred embodiment principally described that data representing the first-state image was extracted as a first-state histogram and that the second-state histogram was augmented by the first-state histogram, the invention is not limited to such a representation of data. Data representing the first-state image can be extracted and applied in other ways, such as a series of data points, for example. The hereinbefore-described calculation and use of area is one example. It will be appreciated that other means of extracting data, without storing the first image, can be implemented. Likewise, it will be appreciated that the second-state histogram can be represented differently.

Although the invention has been shown and described with respect to exemplary embodiments thereof, various other changes, omissions and additions in the form and detail thereof may be made therein without departing from the spirit and scope of the invention.

What is claimed is:

1. A method of identifying a first region within a second-state image, the method comprising:
   providing a first-state image having a first region;
   calculating at least one first-state characteristic representative of at least the first region of the first-state image;
   acquiring the second-state image having the first region and the at least one other region, the second-state image differing from the first-state image;
   calculating a second-state histogram representative of the first region and the at least one other region within the second-state image;
   augmenting the second-state histogram using the at least one first-state characteristic by enhancing the representation of the first region relative to at least one other region to provide an augmented second-state histogram; and
   identifying the first region within the second-state image using the augmented second-state histogram.

2. The method of claim 1 wherein the at least one first-state characteristic is a first-state histogram.

3. The method of claim 2, wherein augmenting the second-state histogram includes combining the first-state histogram with the second-state histogram.

4. The method of claim 2, wherein augmenting the second-state histogram includes
   combining selectively the first-state histogram with the second-state histogram.

5. The method of claim 2, wherein augmenting the second-state histogram includes:
   calculating an area of the first region in the first-state image represented by the first-state histogram;
   removing intensity values in the second-state histogram outside of the area of the first region; and
   combining the first-state histogram with the second-state histogram.

6. The method of claim 1, wherein augmenting the second-state histogram using includes:
   calculating an area of the first region in the first-state image represented by the at least one first-state characteristic; and
   removing intensity values in the second-state histogram outside of the area of the first region thereby enhancing the representation of the first region.

7. The method of claim 1, wherein identifying the first region within the second-state image using the augmented second-state histogram includes
   segmenting the first region with respect to at least one other region within the second-state image using the augmented second-state histogram so as to provide a segmented first region.

8. The method of claim 7, wherein segmenting the first region includes:
   calculating a threshold between peaks of the augmented second-state histogram that segments the first region with respect to the at least one other region within the second-state image; and
   mapping the second-state image using the threshold to produce a binary second-state image.

9. The method of claim 8, for measuring characteristics of one of the at least one other regions in the second-state image, the method further comprising:
   providing a model of at least the first-state image;
   aligning the model with the binary second-state image so as to produce an aligned second-state binary image; and
   measuring characteristics of one of the at least one other regions using the aligned second-state binary image.

10. The method of claim 7, further comprising:
    providing a model of part of the first-state image; and
    measuring characteristics of the segmented first region within the second-state image using the model of the first-state image.

11. The method of claim 7, further comprising
    measuring characteristics of the segmented first region within the second-state image using the at least one first-state characteristic.

12. The method of claim 1, further comprising:
    providing a model of the first-state image; and
    performing a registration of the first-state image to the model to form an aligned first region model containing substantially only the first region; and
    wherein the calculating the at least one first-state characteristic representative of the first region of the first-state image includes:
       calculating the at least one first-state characteristic substantially of only the first region of the first-state image within the aligned first region model.

13. The method of claim 1, wherein the first region is a pad region, and one of the at least one other regions is an applied paste region.

14. The method of claim 1, wherein the first-state image is part of a printed circuit board before application of paste, and the second-state image is the part of the printed circuit board after application of paste.

15. The method of claim 1, wherein the first-state image and a second-state image represent different manufacturing stages.

16. The method of claim 1, wherein the first-state image contains the at least one other region.

17. A method of identifying a first region within a second-state image using at least one first-state characteristic of a first-state image, the method comprising:
    providing a model representative of characteristics and position of the first region;
    identifying a first region within the first-state image using the model;
    calculating the at least one first-state characteristic of the first region once identified;
    acquiring the second-state image, the second-state image differing from the first-state image and having a unknown number of other regions;
    calculating a second-state histogram representative of the first region and the unknown number of other regions within the second-state image;
    augmenting the second-state histogram using the at least one first-state characteristic to provide an augmented second-state histogram that substantially eliminates values in the second-state histogram representative of substantially all but the first region and a second region; and
    calculating a threshold of the augmented second-state histogram so as to substantially identify the first region relative to the second region.

18. The method of claim 17, wherein the at least one first-state characteristic is a first-state histogram.

19. The method of claim 18, further comprising
    combining selectively the first-state histogram with the augmented second-state histogram before calculating a threshold of the augmented second-state histogram which substantially identifies the first region relative to the second region.

20. The method of claim 18, further comprising combining the first-state histogram with the augmented second-state histogram before calculating a threshold of the augmented second-state histogram which substantially identifies the first region relative to the second region.

21. The method of claim 17, further comprising binarizing the second-state image using the threshold to produce a binary image having the first region segmented from a remainder of the second-state image.

22. The method of claim 21, further comprising:

aligning the model to the binary image to produce an aligned binary image; and calculating a change in the first region between the model and the second-state image using the aligned binary image.

23. The method of claim 21, for calculating a change in the first region between the first-state image and the second-state image further comprising:

updating the model with the at least one first-state characteristic once calculated so as to produce an updated model;

aligning the updated model to the binary image to produce an aligned binary image; and comparing the binary image to update the model so as to calculate a change in the first region between the first-state image and the second-state image using the aligned binary image.

24. The method of claim 17, wherein the first region is pad and the second region is paste.

25. A method of using a vision system to identify pad regions of a substrate within a post-paste application image, the method comprising:

providing pre-application image data representative of characteristics of the pad regions before application of paste;

calculating a pre-paste application histogram of the pad regions before the paste is applied on the substrate using the pre-application image data;

acquiring a post-paste application image of the substrate after the paste is applied on the substrate;

calculating a post-paste application histogram of the post-paste application image representative of the pad regions, substrate regions and applied-paste regions;

augmenting the post-paste application histogram using the pre-paste application histogram by changing the representation of the pad region relative to at least one other region to provide an augmented post-paste application histogram; and identifying the pad regions within the post-paste application image using the augmented post-paste application histogram.

26. The method of claim 25, wherein the at least one other region is the substrate region.

27. The method of claim 25, wherein the at least one other region is the paste region.

28. The method of claim 25, wherein augmenting the post-paste application histogram includes:

calculating an area of the pad region before application of the paste represented by the pre-paste application histogram;

removing intensity values in the post-paste application histogram outside of the area of the pad region; and combining selectively the pre-paste application histogram with the post-paste application histogram to provide an augmented post-paste application histogram.

* * * * *